United States Patent [19]

Wada

[11] Patent Number: 4,477,883

[45] Date of Patent: Oct. 16, 1984

[54] ELECTRICALLY ERASABLE PROGRAMMABLE READ ONLY MEMORY

[75] Inventor: Masashi Wada, Yokohama, Japan

[73] Assignee: Tokyo Shibaura Denki Kabushiki Kaisha, Kawasaki, Japan

[21] Appl. No.: 349,912

[22] Filed: Feb. 18, 1982

[30] Foreign Application Priority Data

Feb. 27, 1981 [JP] Japan .................. 56-26911

[51] Int. Cl.$^3$ ............................................ G11C 11/40
[52] U.S. Cl. ...................................... 365/185; 357/23
[58] Field of Search .............................. 365/182, 185; 357/23 VT

[56] References Cited

U.S. PATENT DOCUMENTS

| | | | |
|---|---|---|---|
| 3,728,695 | 4/1973 | Frohman-Bentchkowsky | ... 365/185 |
| 3,825,946 | 7/1974 | Frohman-Bentchkowsky | ..... 357/23 VT |
| 4,099,196 | 7/1978 | Simko | ................................... 357/23 |
| 4,257,056 | 3/1981 | Shum | ............................. 357/23 VT |

FOREIGN PATENT DOCUMENTS

| | | | |
|---|---|---|---|
| 0016386 | 3/1980 | European Pat. Off. | . |
| 0035160 | 9/1981 | European Pat. Off. | ............ 365/185 |
| 2643947 | 3/1978 | Fed. Rep. of Germany | . |

OTHER PUBLICATIONS

Electronics/Feb. 28, 1980, pp. 113–117, "16-K EE-Prom Relies on Tunneling for Byte-Erasable Program Storage", Johnson et al.
Electronics/Jul. 31, 1980, pp. 89–92, "Low-Power EE-Prom Can Be Reprogrammed Fast", by E. K. Shelton.
Triple Level Poly Silicon E$^2$Prom With Single Transistor Per Bit, Tech. Digest of IEDM 1980, pp. 602–605, by J. Kupec et al.
8032 Electronics International, vol. 52, No. 10, (May 10, 1979), C. Wallace, "Electrically Erasable Memory Behaves Like a Fast, Nonvolatile RAM," pp. 128–131.
IEEE Transactions on Electron Devices, vol. ED-24, No. 5, (May 1977), J. Kupec et al., "Triple Level Poly Silicon E2prom With Single Transistor Per Bit," pp. 602–606.

Primary Examiner—Joseph A. Popek
Attorney, Agent, or Firm—Oblon, Fisher, Spivak, McClelland & Maier

[57] ABSTRACT

In an electrically erasable and programmable read only memory of this invention, each memory cell has an L-shaped floating gate insulated from a substrate. The floating gate and a first control gate, the floating gate and a second control gate, and the floating gate and a source electrode connected to a source are capacitively coupled at predetermined capacitances, respectively. A projecting portion which is formed in the source electrode underlies a coupling region of first and second gate portions of the floating gate. When a voltage of +20 V is applied to the source electrode and a voltage of 0 V is applied to the first and second gates, electrons stored in the floating gate of at least one desired memory cell may be discharged.

14 Claims, 10 Drawing Figures

ELECTRICALLY ERASABLE PROGRAMMABLE READ ONLY MEMORY

BACKGROUND OF THE INVENTION

1. Field of the Invention

The present invention relates to a non-volatile semiconductor memory device and, more particularly to a read only memory (ROM) which is programmable and in which the stored data may be electrically erased by the user.

2. Description of the Prior Art

A conventional erasable ROM comprises a plurality of memory cells in a matrix form, each memory cell having a metal oxide semiconductor field effect transistor (MOSFET) which has an electrically insulated floating gate and a control gate overlaid on the floating gate. MOSFETs which are aligned in a row of the ROM are connected to a common word line. MOSFETs which are aligned in a column of the ROM are connected to a common bit line. When data is to be written into the EPROM, a certain row word line and a certain column bit line are selected in response to the data, so that a floating gate of a MOSFET for a desired memory cell is charged. The charging operation of the floating gate is performed by transferring electrons, for example, from the substrate to the floating gate according to tunneling or avalanche injection. The selected MOSFET is maintained in the logic "0" state or the logic "1" state in response to data.

On the other hand, when data stored in the erasable ROM is to be erased or cleared out for writing new data, short wavelength photoemission such as ultraviolet light is radiated on the erasable ROM. Floating gates of the MOSFETs which constitute the memory cells are discharged. As a result, data contents of all memory cells are simultaneously erased. Therefore, even when the erasable ROM is applied to a microprocessor-based system and partial erasure of a microprogram contained in the erasable ROM is desired, all memory contents of the erasable ROM must be cleared out. In this way, according to the conventional erasable ROM, partial or selective erasure of the stored contents cannot be performed.

SUMMARY OF THE INVENTION

It is object of the present invention to provide an electrically erasable and programmable read only memory ($E^2PROM$) which selectively erases only a desired portion of the stored data contents.

According to an $E^2PROM$ of the present invention, a plurality of memory cells are formed on a one-chip semiconductive substrate of one conductivity type in a matrix form. Each memory cell has two diffusion layers which have a conductivity type opposite to that of the substrate and which define a channel region therebetween; and a floating gate insulated from the substrate. The memory cell has first to third electrode layers which are, respectively, capacitively coupled to the floating gate at a predetermined capacitance. The three electrode layers are mutually insulated. The third electrode layer is connected to one of the diffusion layers. A voltage of a first potential is applied to the first and second electrode layers and a voltage of a second potential is applied to the third electrode layer. Then, carriers are injected into the floating gate from the diffusion layers which are connected to the third electrode layer in at least one of the plurality of memory cells. On the other hand, a voltage of the second potential is applied to the first and second electrode layers and a voltage of the first potential is applied to the third electrode layer. Then, carriers are discharged which are stored in the floating gate of at least one of the memory cells.

DETAILED DESCRIPTION OF THE PREFERRED EMBODIMENTS

Figure 1:
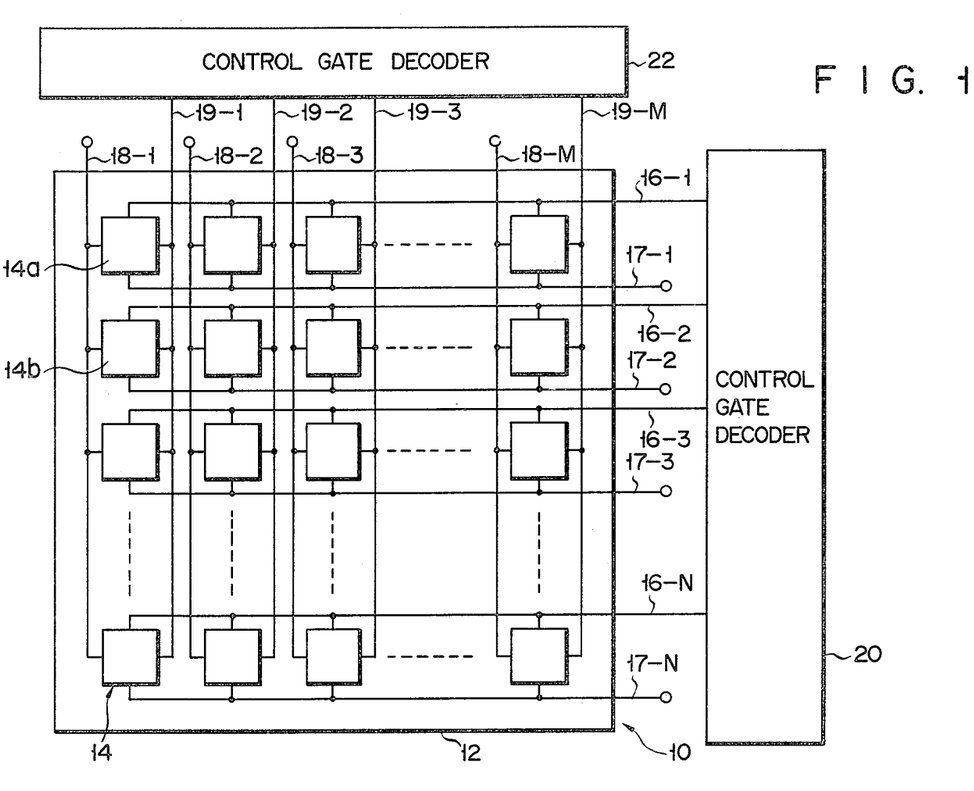
FIG. 1 is a simplified plan view of an $E^2PROM$ according to one embodiment of the present invention, in which a plurality of memory cells are arranged on a one-chip substrate in a matrix form.

Referring now to FIG. 1, an $E^2PROM$ 10 according to one embodiment of the present invention includes a one-chip bulk semiconductive substrate 12. This substrate 12 is made of p-type silicon, for example. A plurality of memory cells 14 are formed on the substrate 12 in the matrix form. Memory cells which are aligned in each row are connected to first and second row lines 16 and 17. On the other hand, memory cells which are aligned in each column are connected to first and second column lines 18 and 19. The first row lines 16 are connected to a row control gate decoder 20, while the second column lines 19 are connected to a column control gate decoder 22. The substrate 12 is grounded.

Figure 2:
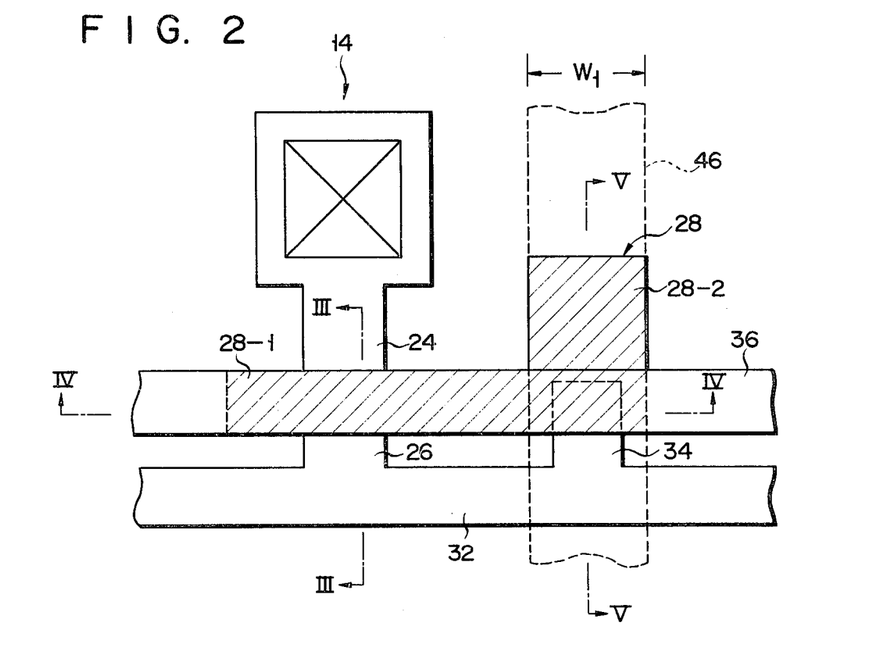
FIG. 2 is an enlarged plan view of a memory cell according to the embodiment of FIG. 1.
Figure 3:
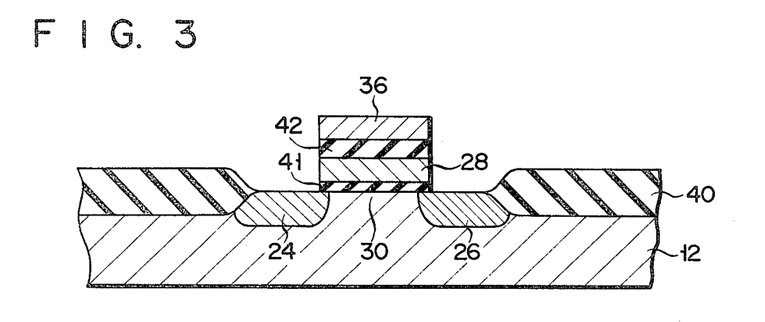
FIG. 3 is a sectional view along the line III—III of the memory cell of FIG. 2.

FIG. 2 is a plan view of a memory cell among the memory cells 14 of FIG. 1. Other memory cells among the memory cells 14 have substantially the same structure as in the memory cell of FIG. 2. FIG. 3 is a sectional view of the memory cell of FIG. 2. An $n^+$-type drain layer 24 and an $n^+$-type source layer 26 are formed on one surface of the substrate 12. A floating gate 28 which is insulated from the substrate 12 is formed, as indicated by the hatched lines in FIG. 2. The floating gate 28 is formed so as to overlie a channel region 30 which is formed between the drain layer 24 and the source layer 26 in the substrate 12. The source layer 26 has a source electrode layer 32 which extends in the row direction in FIG. 2 and is connected through the source electrode layer 32 to sources (not shown) of other transistors which constitute other memory cells. A projecting electrode layer 34, which extends in the column direction in FIG. 2, is formed on part of the source electrode layer 32. On the other hand, part of the floating gate 28 is substantially parallel to the source electrode layer 32. The floating gate 28 is bent in the column direction in correspondence with the projecting electrode layer 34. As a result, the floating gate 28 is of an L-shape. That is, this floating gate 28 comprises a first gate portion 28-1 and a second gate portion 28-2. The projecting electrode layer 34 underlies an intersection of the first and second gate portions 28-1 and 28-2.

Figure 4:
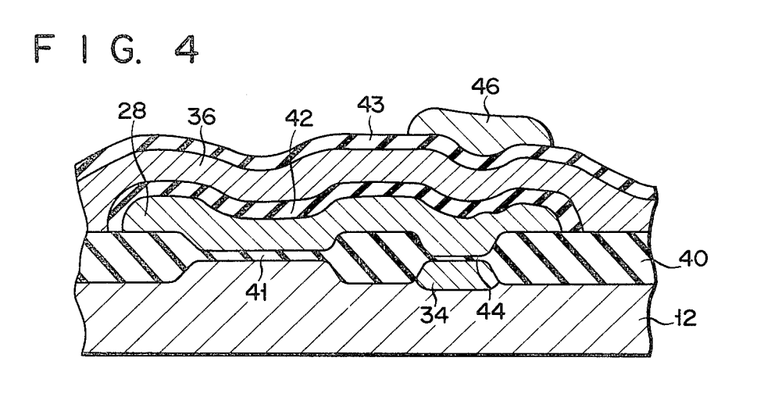
FIG. 4 is a sectional view along the line IV—IV of the memory cell of FIG. 2.

A first electrode layer 36, which is insulated from the floating gate 28, is formed above the floating gate 28. The first electrode layer 36 has a width substantially the same as that of the first gate portion 28-1 of the floating gate 28. Further, the first electrode layer 36 is substantially parallel to the source electrode layer 32. The first electrode layer 36 overlies part of the projecting electrode layer 34 which is formed in the source layer 26. The sectional structure of the memory cell along the line IV—IV extending in the direction of the first electrode layer 36 is shown in FIG. 4. Further, reference numeral 40 denotes a known field oxide film and reference numerals 41, 42, 43 and 44 denote known thermal oxide films in FIGS. 3 and 4.

Figure 5:
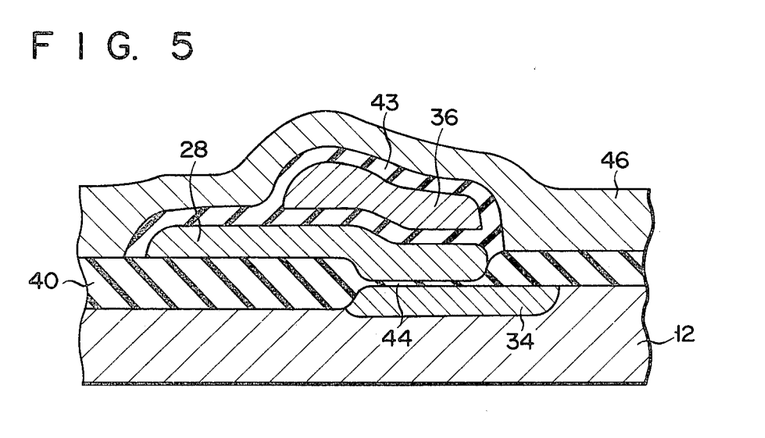
FIG. 5 is a sectional view along the line V—V of the memory cell of FIG. 2.

A second electrode layer 46 is formed above a part of the floating gate 28 of L-shape which extends along the row direction and insulated from the floating gate 28 by the thermal oxide film 43. The second electrode layer 46 is illustrated by the broken line in order to simplify the drawing in FIG. 2. The second electrode layer 46 extends in the row direction in the figure. The sectional structure of the second electrode layer 46 in the row direction, the line V—V is shown in FIG. 5. The second electrode layer 46 has a width $W_1$ which is substantially the same as that of the floating gate 28 and which is wider than that of the projecting electrode layer 34. The first and second electrode layers 36 and 46 function as the control gates which control the charge and discharge of the electrons in the floating gate 28. Therefore, the first and second electrode layers 36 and 46 are referred to as the first and second control gates 36 and 46 hereinafter.

In the memory cell with the above structure, the first control gates 36 includes in each row are commonly connected to the first row line 16 (to be referred to as a first control gate common line 16 hereinafter) of FIG. 1. The source layers 26 of these cells are commonly connected to the second row line 17 (to be referred to as a source common signal line 17 hereinafter) through the source electrode layers 32 integrally formed with the source layer 26. On the other hand, the drain layers 24 of the memory cells included in each column are commonly connected to the first column line 18 (to be referred to as a drain common signal line 18 hereinafter) of FIG. 1. The second control gates 46 of these memory cells are commonly connected to the second column line 19 (to be referred to as a second control gate common line 19 hereinafter). The floating gate 28, the first control gate 36 and the second control gate 46 are made of n+-type polycrystalline silicon, for example, and formed to a thickness of about 4,000 Å. The thermal oxide films 41, 42 and 43 are formed to a thickness of about 600 Å. The thermal oxide film 44 is formed to a thickness of about 200 Å, which is smaller than the thickness of the thermal oxide films 41, 42 and 43. In the embodiment, the substrate 12, the source layer 26, the floating gate 28 and the first and second control gates 36 and 46 are insulated from each other. In order words, the substrate 12, the source layer 26 and the first and second control gates 36 and 46 are capacitively coupled to the floating gate 28. The electrically equivalent circuit diagram of this arrangement is shown in FIG. 6.

Figure 6:
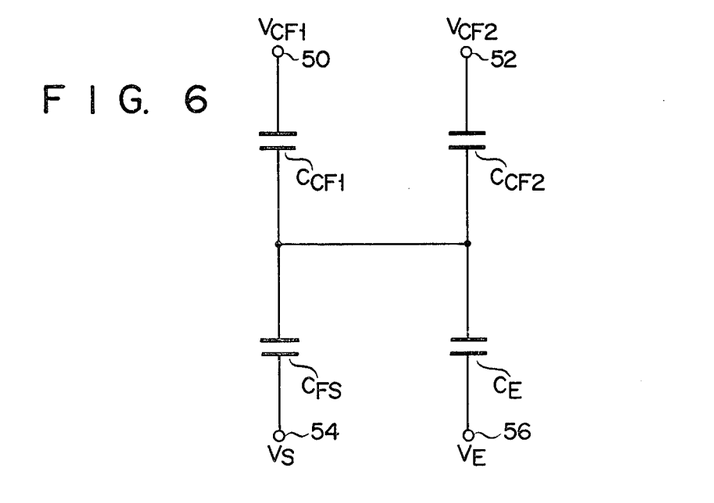
FIG. 6 shows an equivalent circuit diagram for explaining capacitive coupling between electrode layers and a floating gate which are formed on the memory cell of FIG. 2.

Referring to FIG. 6, terminals 50 and 52 (the terminals 50 and 52 are not actually formed in the actual memory cell) of the equivalent circuit are connected to the first and second control gates 36 and 46, respectively. Therefore, potentials $V_{CF1}$ and $V_{CF2}$ at the terminals 50 and 52, respectively, correspond to the potentials at the first and second control gates 36 and 46. Further, $C_{CF1}$ denotes a coupling capacitance between the floating gate 28 and the first control gate 36. Similarly, $C_{CF2}$ denotes a coupling capacitance between the floating gate 28 and the second control gate 46. On the other hand, a terminal 54 of the equivalent circuit is connected to the substrate 12. Therefore, $V_S$ corresponds to the potential of the substrate 12. Further, $C_{FS}$ denotes a coupling capacitance between the floating gate 28 and the transistor region of the substrate 12. Similarly, a terminal 56 of the equivalent circuit is connected to the source layer 26. $V_E$ denotes the source potential. $C_E$ corresponds to a coupling capacitance between the floating gate 28 and the source layer which is formed below by the first and second control gates 36 and 46. The coupling capacitances $C_{CF1}$ and $C_{CF2}$ between the floating gate 28 and the first control gate 36 and between the floating gate 28 and the second control gate 46 are subtantially the same. The coupling capacitance $C_E$ between the source electrode layer 32 (source layer 26) and the floating gate 28 is smaller than the coupling capacitances $C_{CF1}$ and $C_{CF2}$. (Here, the dielectric constants of the insulating films under the first and second control gates 36 and 46 may be different.) The potential $V_{FG}$ of the floating gate 28 is expressed as follows:

$$V_{FG} = \frac{C_{CF1} \cdot V_{CG1} + C_{CF2} \cdot V_{CG2} + C_E \cdot V_S + C_{FS} \cdot V_E}{C_{FS} + C_{CF1} + C_{CF2} + C_E}$$

When the source potential $V_E$ is fixed (the substrate 12 is grounded as described above), the first and second control gates 36 and 46 are operated between a low potential (to be referred to as a potential L hereinafter) and a high potential (to be referred to as a potential H hereinafter). Three kinds of operational states are accomplished by a combination of potential levels of the first and second control gates 36 and 46. When the first and second control gates 36 and 46 are set to the potential H, this operational state is defined as a first state. In this state, the potential $V_{FG}$ has a first value $V_{FG1}$. When one of the first and second control gates 36 and 46 is set to the potential H, this operational state is defined as a second state. In this state, a second value $V_{FG2}$ is obtained. A third state is accomplished when the first and second control gates 36 and 46 are set to the potential L. Thus, a third value $V_{FG3}$ is obtained.

The most of operation of the E²PROM according to one embodiment of the present invention will be described. In the initial state, assume that no carrier is charged in the floating gate 28 of each memory call 14 of the E²PROM 10. When data is to be written in a certain memory cell, for example, a memory cell 14a (FIG. 1), a voltage of 0 V is supplied to the drain common signal lines 18 and the source common signal lines 17. The potential of the drain layers 24 and the source layers 26 of all memory cells 14 including the certain memory cell 14a is set at 0 V. A voltage of +20 V, for example, is supplied to the first control gate common line 16-1 commonly connected to the row which includes the memory cell 14a and to the second control gate common line 19-1 commonly connected to the column which includes the memory cell 14a. Simultaneously, a voltage of 0 V is supplied to the first control gate common lines 16-2, 16-3, ..., 16-N and the second control gate common lines 19-2, 19-3, ..., 19-M which are not connected to the memory cell 14a. Therefore, the potential at the first and second control gates 36 and 46 of the memory cell 14a is set at +20 V. As a result, the floating gate 28 of the memory cell 14a is set at the potential H. Further, a tunneling current flows through the thermal oxide film 44 located at a region in which the first and second control gates 36 and 46 intersect. The electrons as the majority carrier are injected into the floating gate 28 by the tunneling current. The writing state of the memory cell 14a is set to "0". In other words, a voltage applied to the first row lines 16 and the second column lines 19 is controlled so as to set the first and second control gates 36 and 46 at the potential H, thus writing data into the desired memory cell. In this manner, the desired data is stored in the E²PROM 10.

A case will be described in which only the stored content of an arbitrary memory cell is erased. Assume that the data content of a memory cell 14b is to be erased and the contents of other memory cells are retained. In this case, a voltage of +20 V is supplied to the source common signal lines 17. The source potential of all memory cells 14 is thus set at +20 V. The drains of all memory cells 14 connected to the drain common signal lines 18 are set to the floating condition. Further, in order to set the potential of the first and second control gates 36 and 46 of the memory cell 14b at 0 V, a voltage of 0 V is supplied to the first control gate common line 16-2 and the second control gate common line 19-1 which are connected to the memory cell 14b. A voltage of +20 V is supplied to the first control gate common lines 16-1, 16-3, ..., 16-N except for the first control gate common line 16-2 and to the second control gate common lines 19-2, 19-3, ..., 19-M except for the second control gate common line 19-1. As a result, the potential of the floating gate 28 of the selected memory cell 14b only is set to the potential L, causing tunneling. Therefore, the electrons are emitted from the floating gate 28 to the source layer 26. In this manner, only this memory cell 14b is set to the erasing state, that is, the writing state "1".

As described above, according to the first embodiment of the present invention, when data is to be written into or erased from a desired memory cell, the first and second control gates 36 and 46 and the source electrode layer 32 act substantially as the control electrodes. Data is selectively written into or erased from a certain memory cell by changing the voltage applied to the above three electrodes. The voltage applied to the electrodes is summarized in the following table.

TABLE

|  | Writing | Erasure |
| --- | --- | --- |
| Potential at 1st control gate of selected cell | H | L |
| Potential at 1st control gates of non-selected cells | L | H |
| Potential at 2nd control gate of selected cell | H | L |
| Potential at 2nd control gates of non-selected cells | L | H |
| Potential at the source | L | H |

TABLE-continued

|  | Writing | Erasure |
| --- | --- | --- |
| of cell | | |

(Where H and L, respectively, denote the high potential and the low potential.)

When data stored in the E²PROM of the embodiment of the present invention is to be read out, a voltage for readout which is in the range of the potential H (+20 V) and the potential L (0 V), for example, +5 V is applied to the drain common signal line 18 and the first control gate common line 16. The data content stored in the selected memory cell can be read out. Data readout is performed by using the row control gate decoder 20 of FIG. 1. Therefore, the control gate decoders which are not used for readout must be maintained at a potential lower than that of the readout voltage in order to prevent the current flowing into the channels of the non-selected memory cells.

Figure 7:
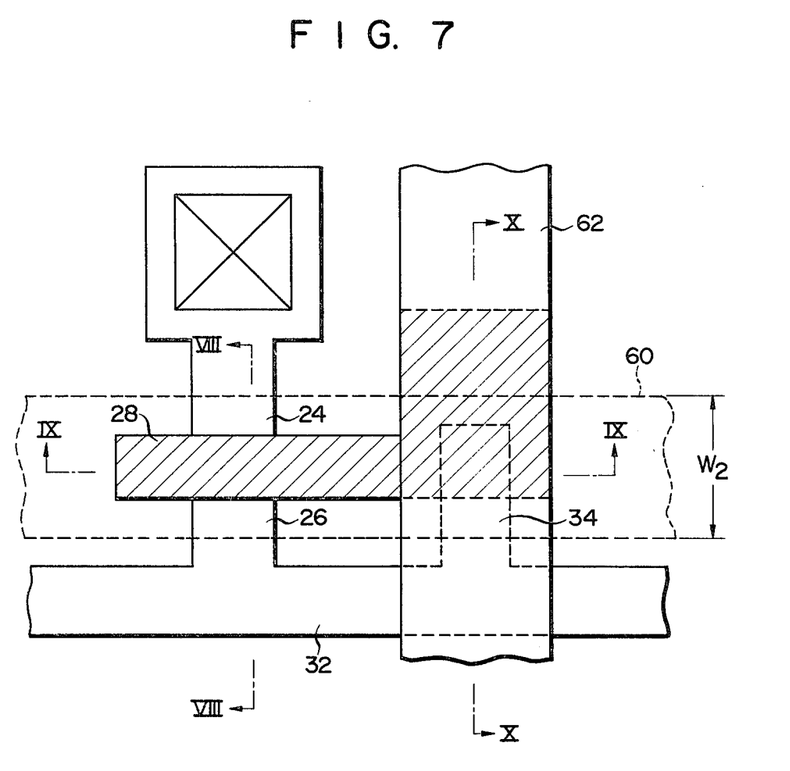
FIG. 7 is an enlarged plan view of the memory cell as in FIG. 1 according to another embodiment of the present invention.
Figure 8:
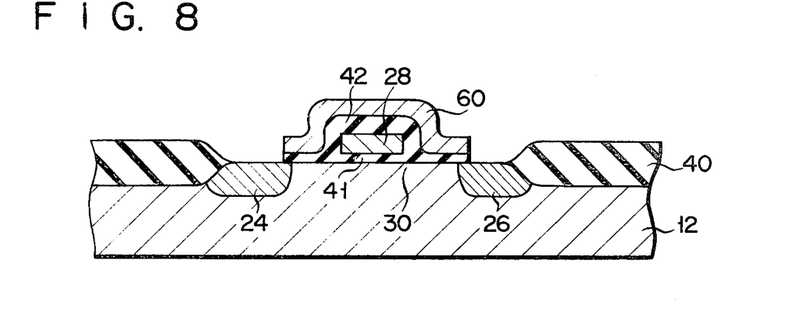
FIG. 8 is a sectional view along the line VIII—VIII of the memory cell of FIG. 7.
Figure 9:
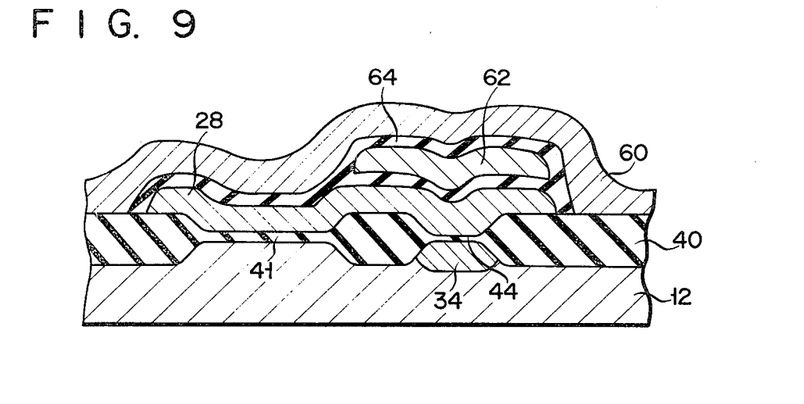
FIG. 9 is a sectional view along the line IX—IX of the memory cell of FIG. 7.
Figure 10:
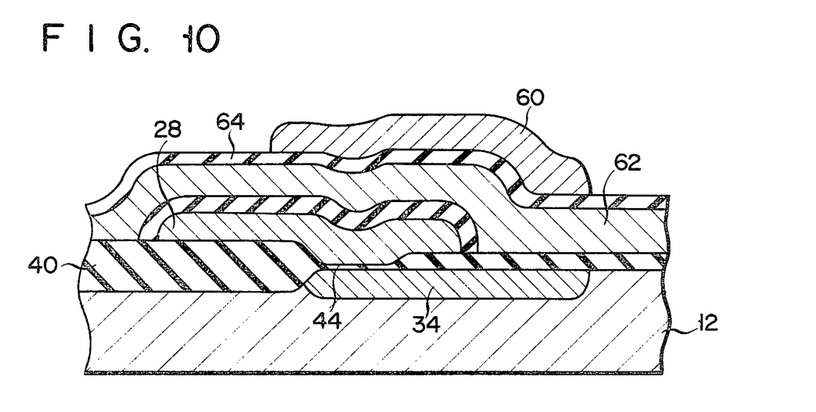
FIG. 10 is a sectional view along the line X—X of the memory cell of FIG. 7.

FIG. 7 is a plan view of a memory cell used in the E²PROM according to another embodiment of the present invention. In the second embodiment, a first control gate 60 has a width $W_2$ greater than that of the floating gate 28. FIG. 8 shows a sectional view of the structure of the memory cell of FIG. 7 along the line VIII—VIII of FIG. 7. The first control gate 60 overlies so as to surround the floating gate 28. A second control gate 62 is formed above the L-shaped floating gate 28 overlying a part of the projecting electrode 34 which is projected from the source electrode 32. The second control gate 62 is insulated from the floating gate 28 by the thermal oxide film 42, as shown in FIG. 9. The first control gate 60 is formed above the second control gate 62. FIG. 10 is a sectional view of the memory cell along the line X—X of FIG. 7. The second control gate 62 is insulated from the first control gate 60 by a thermal oxide film 64. According to the second embodiment, as is apparent from FIGS. 9 and 10, the second control gate 62 is formed above the floating gate 28. The first control gate 60 overlies the second control gate 62. As compared with the first embodiment shown in FIGS. 2 to 5, the positional relation of the first and second control gates is reversed. The first control gate 60 is formed substantially in the uppermost position. Other structural details of the second embodiment are the same as in the first embodiment, and the detailed description thereof will be omitted.

In the E²PROM having memory cells with the above structure, substantially the same effect is accomplished. According to the memory cell of FIGS. 7 to 10, the first control gate 60 has a width greater than that of the floating gate 28. If the threshold value at the foot of the first control gate 60 is set to be high, the threshold value of the memory cell is determined by the above threshold value. Therefore, the memory cell may not be entered in the depression mode when data is erased. Data stored in the selected cell is properly read out in the readout mode.

As described above, electrons can be selectively charged into or discharged from the floating gate 28 of each memory cell according to the present invention. Therefore, when the erasure mode is performed, the data content stored in the desired memory cell is selectively cleared out. The user can easily modify part of the data stored in the E²PROM. Further, in the memory cell of the present invention, the coupling capacitance $C_{CF1}$ between the first control gate and the floating gate 28 is set to be equal to the coupling capacitance $C_{CF2}$ between the second control gate and the floating gate 28. Simultaneously, the coupling capacitance $C_E$ of the third electrode (source electrode layer) is set to be lower than the coupling capacitances $C_{CF1}$ and $C_{CF2}$. The decrease in the ON/OFF rate of the transistor of the memory cell due to the variation of the coupling capacitances $C_{CF1}$ and $C_{CF2}$ can be eliminated. Therefore, the operating margin can be maintained high, thus increasing the reliability of the E$^2$PROM.

Although the present invention has been shown and described with respect to particular embodiments, nevertheless, various changes and modifications which are obvious to a person skilled in the art to which the invention pertains are deemed to lie within the spirit, scope, and contemplation of the invention.

In the above embodiment, the electrons are charged into the floating gate 28 by the tunneling current. However, the present invention is not limited to this charging. In the same manner as in the conventional method, "hot" electrons can be charged from the transistor region into the floating gate 28 by utilizing the control gate signal lines 16 and 19. Further, in the above embodiment, the p-type substrate is used. However, apparently, an n-type substrate may be used. In this case, the conductivity type of the source and the drain is reversed.

What is claimed is:

1. An electrically erasable and programmable read only memory device comprising:
   a semiconductive substrate of one conductivity type;
   a plurality of memory cells arranged on said substrate in a matrix form, each memory cell comprising; first and second diffusion layers which are formed on said substrate to have a conductivity type opposite to that of said substrate, and which define a channel region therebetween, and a floating gate insulated from said substrate;
   first control electrode layers capacitively and commonly coupled to floating gates of a first group of said plurality of memory cells which are included in each array of a first number of cell arrays aligned in a first direction of said memory cell matrix, said first control electrode layers being insulated from said substrate;
   second control electrode layers capacitively and commonly coupled to floating gates of a second group of said plurality of memory cells which are included in each array of a second number of cell arrays aligned in a second direction that intersects said first direction of said memory cell matrix substantially at right angles, said second control electrode layers being insulated from said substrate and said first control electrode layers;
   third electrode layers each of which is commonly coupled to the first diffusion layers of said memory cells included in the corresponding one of said first number of cell arrays and which are electrically separated from said substrate and insulated from said floating gates and said first and second electrode layers, said third electrode layers being capactivively and commonly coupled to said floating gates of said memory cells included in each of said first number of cell arrays; and
   means, electrically connected to said first, second and third electrode layers, for controlling the level of a voltage applied to said first, second and third electrode layers so as to selectively charge or discharge carriers only in or from the floating gate of an arbitrary memory cell of said matrix memory cells.

2. A device according to claim 1, wherein the capacitance between said floating gate and said first electrode layers is substantially the same as the capacitance between said floating gate and said second electrode layers.

3. A device according to claim 2, wherein the capacitance between said floating gates and said third electrode layers is set to be smaller than the capacitance between said floating gates and said first electrode layers and the capacitance between said floating gates and said second electrode layers.

4. A device according to claim 1, wherein said floating gates each have a first gate portion overlying said channel region defined by said first and second diffusion layers and extending in a predetermined first direction, and a second gate portion extending from an end portion of said first gate portion in a second direction perpendicular to the first direction so that said floating gate is of L-shaped as a whole.

5. A device according to claim 4, wherein said first and second diffusion layers have an increased impurity concentration of the opposite conductivity type and, correspond respectively to source and drain.

6. A device according to claim 4, wherein each of said first electrode layers overlies said first gate portion of each of said floating gates and extends in the first direction.

7. A device according to claim 4, wherein each of said third electrode layers extends substantially parallel to the first direction and has a projection layer projecting in the second direction.

8. A device according to claim 7, wherein said projecting layer of said electrode layer underlies a region corresponding to said end portion of said first gate portion of said floating gate.

9. A device according to claim 1, wherein each memory cell of said plurality of memory cells arranged on said substrate in the matrix form subtantially comprises a metal oxide semiconductor transistor, said transistor comprising said diffusion layers, said first electrode layer, said second electrode layer and said third electrode layer.

10. A device according to claim 9, wherein said first electrode layers of memory cells aligned in the same row among said memory cells are commonly connected to a row line, so that a voltage of a potential substantially the same as one of the first and second potentials is applied to said first electrode layers through said row line.

11. A device according to claim 9, wherein said second electrode layers of memory cells aligned in the same column among said memory cells is commonly connected to a column line, so that a voltage of a potential substantially the same as one of the first and second potentials is applied to said second electrode layers through said column line.

12. A device according to claim 9, wherein said third electrode layers formed on said memory cells is supplied with a voltage of a potential substantially the same as one of the first potential or the second potential in response to mode selection between data writing and data erasure.

13. A device according to claim 1, wherein, to charge carriers in the floating gate of a specific memory cell which is arbitrarily selected, said voltage-application controlling means applies a voltage of first potential to those of said first and second electrode layers which are capacitively coupled to said floating gate of said specific memory cell and applies a voltage of second potential to one of said third electrode layers which is capacitively coupled to said floating gate of said specific memory cell.

14. A device according to claim 13, wherein, to discharge carriers from the floating gate of a specific memory cell which is arbitrarily selected, said voltage-application controlling means applies the voltage of the second potential to those first and second electrode layers which are capacitively coupled to said floating gate of said specific memory cell and applies the voltage of the first potential to one of said third electrode layers which is capacitively coupled to said floating gate of said specific memory cell.

* * * * *